(12) United States Patent
Feiweier

(10) Patent No.: US 10,732,243 B2
(45) Date of Patent: Aug. 4, 2020

(54) METHOD AND APPARATUS FOR OPTIMIZATION OF A TIME PROGRESSION OF A MAGNETIC RESONANCE CONTROL SEQUENCE

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/025,505

(22) Filed: Jul. 2, 2018

(65) Prior Publication Data

US 2019/0011518 A1 Jan. 10, 2019

(30) Foreign Application Priority Data

Jul. 4, 2017 (EP) .................................. 17179493

(51) Int. Cl.
*G01R 33/54* (2006.01)
*G01R 33/36* (2006.01)
*G01R 33/563* (2006.01)
*G01R 33/385* (2006.01)

(52) U.S. Cl.
CPC ........... *G01R 33/543* (2013.01); *G01R 33/36* (2013.01); *G01R 33/385* (2013.01); *G01R 33/56341* (2013.01)

(58) Field of Classification Search
CPC ........... G01R 33/5608; G01R 33/4835; G01R 33/543; G01R 33/50; G01R 33/56341; G01R 33/246
See application file for complete search history.

(56) References Cited

U.S. PATENT DOCUMENTS

| 5,786,692 A | * | 7/1998 | Maier | .............. G01R 33/56341 324/307 |
| 2008/0204179 A1 | | 8/2008 | Schuster et al. | |
| 2009/0240379 A1 | * | 9/2009 | Feiweier | ................ A61B 6/586 700/295 |
| 2013/0075068 A1 | | 3/2013 | Huber et al. | |
| 2016/0166209 A1 | * | 6/2016 | Itu | .......................... A61B 5/026 600/408 |
| 2017/0285123 A1 | * | 10/2017 | Kaditz | ............... G01R 33/5608 |

OTHER PUBLICATIONS

Freitag, et al.: "Reducing Short Term Gradient Heating by Usage of Adapted Encoding Schemes"; Proceedings of the International Society for Magnetic Resonance in Medicine; ISMRM; 19th Annual Meeting and Exhibition; Montreal; Quebec, May 7-13, 2011; Apr. 23, 2011; p. 3789; (2011).

* cited by examiner

*Primary Examiner* — Alesa Allgood
(74) *Attorney, Agent, or Firm* — Schiff Hardin LLP

(57) ABSTRACT

In a method and magnetic resonance (MR) apparatus or optimizing a time progression of an MR control sequence that operates an MR scanner of the MR apparatus so as to execute at least two sequence modules, a property of a component of the magnetic resonance apparatus is detected, and a first requirement of the component is determined for a first sequence module of the at least two sequence modules. A second requirement of the component is detected for a second sequence module of the at least two sequence modules. The time progression of the at least two sequence modules is optimized, taking account of the property, the first requirement and second requirement.

19 Claims, 4 Drawing Sheets

METHOD AND APPARATUS FOR OPTIMIZATION OF A TIME PROGRESSION OF A MAGNETIC RESONANCE CONTROL SEQUENCE

BACKGROUND OF THE INVENTION

Field of the Invention

The invention concerns a method, a magnetic resonance (MR) apparatus, and an electronically readable data storage medium for optimizing a time progression of an MR control sequence.

Description of the Prior Art

In a magnetic resonance apparatus, the body of an examination object, such as a patient, is exposed to a relatively high basis magnetic field, for example of 1.5 or 3 or 7 tesla, using a basic field magnet of an MR Scanner. In addition, gradient pulses are activated by a gradient coil arrangement. Radio-frequency (RF) pulses, for example excitation pulses, are then radiated by an RF antenna by suitable antenna coils, which results in nuclear spins of specific atoms, which are resonantly excited by these RF pulses, being tilted by a defined flip angle relative to the magnetic field lines of the basic magnetic field. During relaxation of the nuclear spins, RF signals called magnetic resonance signals are emitted, which are received by suitable RF antennas and then further processed. The desired image data can ultimately be reconstructed from the raw data acquired in this manner. In particular, raw data are captured in a spatially defined portion of the examination object under investigation, the examination region. The image data visually depict the examination region.

A specific magnetic resonance control sequence (MR control sequence), also known as a pulse sequence, is composed of a succession of RF pulses, for example excitation pulses and refocusing pulses, together with gradient pulses to be emitted in a matching, coordinated manner in different gradient axes along different spatial directions such as MR sequence must therefore be emitted for a particular measurement. Temporally matching read-out windows are set, which specify the periods in which the induced magnetic resonance signals are acquired. Emission of the RF pulses and the gradient pulses requires power, which is supplied to the magnetic resonance scanner and converted into the corresponding pulses by the magnetic resonance scanner. At least certain components of the magnetic resonance scanner are thermally loaded thereby, and may be heated. It is typically necessary to restrict this heating. The heating may be limited by cooling. This is described, for example, in DE 10 2011 083 204 A1 and DE 10 2007 009 204 A1. In addition, MR control sequences are typically designed such that intervals occur between specific RF pulses and/or gradient pulses and/or at the end of the MR control sequence, which intervals are free of RF pulses and/or gradient pulses. In these intervals, the magnetic resonance scanner is free of any additional significant thermal load.

With health services under increasing cost pressure, the requirement for magnetic resonance examinations to take only a short time is of greatly increasing importance. Despite the introduction of techniques for speeding up the process, such as parallel imaging, "compressed sensing" or simultaneous multislice imaging, the acquisition times for many measurements still lie in the range of several minutes, such that any approach to reducing measuring time further—ideally in combination with the above-stated techniques—is of significance. In some cases hardware component limitations, typically power engineering limitations, determine the limits for further reducing acquisition times. If these limits are not utilized or are estimated too conservatively, measurements take an unnecessarily long time.

Conventionally, heuristic reference parameters are specified for describing hardware components. MR control sequences are designed in accordance with these reference parameters. It is possible in this way to describe a limitation of the gradient coil amplifiers in terms of a reference amplitude: so gradient pulses have an amplitude that is less than the reference amplitude, so that the ability to execute an MR control sequence that includes the gradient pulses is typically ensured over the duration of the examination. Such gradient pulses and MR control sequences are typically selected on a conservative basis and utilize the limitation of the gradient coil amplifiers only for a few gradient pulses in the MR control sequence. No consideration is given to short-term execution of gradient pulses with amplitudes above the reference amplitude.

Model-based methods, as described in DE 10 2008 015 261 B4, make far better use of the available hardware components. In model-based methods, the limiting hardware component is described by a model, whereby amplitudes above the reference amplitude can be used for individual gradient pulses and/or individual sequence modules. In addition, intervals for complying with long-term limitations can be automatically determined. It is thus possible in the short term to use gradient pulses with amplitudes above the reference amplitude if sufficiently long intervals are observed thereafter.

SUMMARY OF THE INVENTION

An object of the present invention is to provide an efficient method for optimizing the time progression of an MR control sequence.

The method according to the invention for optimizing the time progression of an MR control sequence, according to which MR control sequence a magnetic resonance scanner is drivable operable, wherein the MR control sequence has at least two sequence modules, has the following method steps.

A property of a component of the magnetic resonance scanner is detected.

A first requirement placed on the component for a first sequence module of the at least two sequence modules is determined in a processor.

A second requirement placed on the component for a second sequence module of the at least two sequence modules is also determined in the processor.

The time progression of the at least two sequence modules is optimized in the processor, taking account of the property, the first requirement and the second requirement. The scanner is operated with this optimized time progression.

The method is typically provided with an MR control sequence to be optimized, which may be designated an original MR control sequence. The time progression of RF pulses and gradient pulses and read-out windows included in such an MR control sequence is significant for image data requiring reconstruction. The time progression of sequence modules in an MR control sequence is preferably variable. The original MR control sequence comprises has a predetermined original progression of the at least two sequence modules. The original time progression of the at least two sequence modules requires optimization using the method according to the invention.

A sequence module is typically a time portion of the MR control sequence that includes at least one RF pulse and/or one gradient pulse and/or one read-out window. A time progression of the RF pulses and/or gradient pulses and/or read-out windows in a sequence module is typically rigidly predetermined for generating image data of a specific contrast. A sequence module is a self-contained portion of an MR control sequence, according to which portion a defined quantity of raw data with a defined contrast are generated or acquired.

The first sequence module may be configured to generate and/or acquire first raw data of a first subregion of the examination region with a first contrast. The second sequence module may be configured to generate and/or acquire second raw data of a second subregion of the examination region with a second contrast.

At least the first subregion is preferably different from the second subregion and/or the first contrast from the second contrast. A specific contrast may be generated by a sequence module having, for example, a diffusion weighting in a specific direction and/or a specific b-value. A specific contrast may be generated by a sequence module causing suppression of a signal from a specific tissue type during raw data acquisition in the sequence module. The raw data acquired with all the sequence modules in the MR control sequence can be reconstructed into image data, which depicts the examination region with a contrast, and/or a function of the examination region, such as a diffusion map.

The first subregion and/or the second subregion are subregions of the examination region. The first subregion and/or the second subregion are thus subregions of the raw data domain (k-space). The first subregion thus may be characterized by the points of k-space in the first subregion matching in at least one coordinate. The at least one matching coordinate is preferably determined by the phase-coding. Likewise, the second subregion may be characterized by points of k-space in the second subregion matching in at least one coordinate. The MR control sequence may repeat the first sequence module and/or the second sequence module.

The component is exposed to loading when the first sequence module and/or the second sequence module is being activated. The component typically is at least one element and/or at least one self-contained functional unit of the magnetic resonance scanner. The component may be configured to activate gradient pulses or radiate RF pulses in the first sequence module and/or the second sequence module. The component is typically distinguished by the property. The property typically is a technical specification of the component. The property preferably distinguishes the component with regard to the first requirement and/or the second requirement. The control computer or an optimization processor of the magnetic resonance scanner may be configured to establish the property, for example a technical feature of the magnetic resonance scanner or of the component. The property may be stored on a memory of the magnetic resonance scanner and is provided to the control computer or the optimization from the memory.

One requirement placed on the component for a sequence module is typically a configuration or capability of the component that is necessary for activating the sequence module and/or to make practicable the MR control sequence that includes the sequence module. The first requirement is dependent on the component and the first sequence module. The second requirement is dependent on the component and the second sequence module.

The first requirement may be determined by the control computer and/or by the optimization processor. To this end, an analysis of the first sequence module preferably takes place. If the component is an RF amplifier, when establishing the first requirement RF pulses may be extracted from the first sequence module and analyzed with regard to duration and/or amplitude. On the basis of the number of the RF pulses, the time interval between them, their respective duration and/or respective amplitude, a power required by the RF amplifier can be determined for the first sequence module. This required power may be included in the first requirement. The same applies to the second requirement placed on the second sequence module. When ascertaining the first requirement and/or the second requirement, the control computer and/or the optimization processor may optionally access a database and/or memory in which information is stored. Such information may be a relationship between an RF pulse with a specific duration and/or a specific amplitude, and a requirement placed on the component.

Optimization of the time progression of at least the first sequence module and the second sequence module typically proceeds on the basis of the property, the first requirement and the second requirement. The time progression of the at least two sequence modules is preferably adapted by the MR control sequence such that the optimized MR control sequence exhibits the optimized time progression of the at least two sequence modules. If the optimized time progression differs from the original time progression, the optimized MR control sequence will typically differ from the original MR control sequence. Optimization of the time progression of the MR control sequence preferably proceeds taking account of at least some of the sequence modules included in the MR control sequence, particularly preferably taking account of all the sequence modules included in the MR control sequence. In this case, a requirement placed on the component is preferably established for each sequence module taken into account and is itself taken into account for optimization of the time progression of the sequence modules. When optimizing the time progression of the MR control sequence, the order of at least two sequence modules is typically changed.

An advantage of the method according to the invention is that the duration of the intervals between sequence modules may be shortened. In this way, the total duration of the MR control sequence may also be reduced. The method according to the invention may be combined with known acceleration techniques such as parallel imaging, "compressed sensing" or simultaneous multislice imaging. In addition, the component is preferably continuously loaded, wherein loading of the component proceeds within the specification of the component. Loading of the component may in this case proceed with only minor fluctuation, so the component is subjected to particularly gentle use. The service life of the component may thereby be increased. In addition, optimization based on the first requirement and the second requirement enables individual adaptation for the first sequence module and the second sequence module of the time progression of the MR control sequence to the magnetic resonance scanner, which is configured to play out the MR control sequence to generate raw data. The duration of the MR control sequence may thus be optimized with regard to the sequence modules included in the MR control sequence, the requirements they place on the component and the individual magnetic resonance scanner. An MR control sequence optimized using the method according to the invention may typically be carried out by the magnetic resonance scanner, since the property of the component has been taken into account. In addition to the component, further components of the magnetic resonance scanner may be taken into account when carrying out the method according to the invention.

The method according to the invention extends the model-based approach by a variable time progression of the sequence modules. The time progression of the sequence modules is typically variable in the case of the method according to the invention. In this case, the property, in particular a performance of the component, may be taken into account. Under specific conditions, the duration of the necessary intervals between two successive sequence modules and/or a necessary interval at the end and/or after conclusion of the MR control sequence may in this way be reduced.

In an embodiment of the method, the first requirement is the power of the component required for the first sequence module and/or the second requirement is the power of the component required for the second sequence module. The component is necessary for activating the first sequence module and/or the second sequence module. The first requirement is accordingly typically a measure of the loading of the component when the first sequence module is being activated. The second requirement is accordingly typically a measure of the loading of the component when the second sequence module is being activated. The first requirement may also be the power to be provided to the component within the framework of the first sequence module. The second requirement may also be the power to be provided to the component within the framework of the second sequence module. According to this embodiment, the first requirement and/or the second requirement can be determined particularly precisely. In this way, optimization of the MR control sequence can proceed particularly efficiently.

In another embodiment of the method, the property designates a limitation for the component. If the component is used within the limitation, reliable use and/or functionality and/or defined precision of the component is/are typically ensured. In particular, when the MR control sequence is activated in compliance with the limitation, the MR control sequence is not aborted. The limitation may be, for example, a maximum permissible power that can be supplied to the component over a specific period. The limitation may be, for example, a maximum permissible power that can be produced as an output by the component over a specific period. The property may also designate a measure of the loading capacity of the component. Preferably, the property is a maximum permissible power, and a corresponding duration during which the component may be loaded with the maximum permissible power. The property may also be different maximum permissible powers for different durations. This embodiment of the method allows particularly good utilization of the technical specification of the component. In this way, optimization of the MR control sequence can result in the duration being shortened by a significant amount.

In another embodiment of the method, the time progression is optimized such that the first requirement and the second requirement comply with the property of the component over a time-based average. The timing of the first sequence module and of the second sequence module is preferably selected such that the demands thereof on the component do not exceed the maximum permissible loading of the component over the time-based average. The property of the component is preferably linked to a duration during which the property is to be complied with. This embodiment accordingly enables balanced loading of the component over the duration, which is a characteristic duration for the component and/or a duration linked to the property of the component. In comparison with the model description of the component known from the prior art and a time-averaged consideration of loading, according to this embodiment necessary intervals in the MR control sequence may be reduced. This may reduce patient investigation time.

In another embodiment of the method, the time progression is optimized such that the duration of a part of the MR control sequence that includes the first sequence module and the second sequence module, and/or the total duration of the MR control sequence, is minimized. The time progression is preferably optimized such that the total duration of the MR control sequence is reduced compared to the duration of the original MR control sequence. The duration of the patient examination can be reduced in this way. This makes investigations less costly and/or allows better utilization over time of the magnetic resonance scanner.

In another embodiment of the method, the time progression is optimized such that loading of the component on the basis of the first requirement and on the basis of the second requirement is constant over a time-based average. Loading of the component on the basis of the first requirement and on the basis of the second requirement is preferably at least largely constant over the time-based average. The time-based average may be, for example, a period comprising that includes the first sequence module and the second sequence module. The MR control sequence typically has numerous sequence modules. The time progression, i.e. the order of the numerous sequence modules, is preferably selected such that loading of the component averaged over a period comprising a small number of successive ones of the numerous sequence modules is largely constant during execution of the MR control sequence, i.e. amounts to a deviation of less than 30%, preferably less than 15%, from the loading of the component averaged over a period that includes the numerous sequence modules. This embodiment of the method enables balanced driving of the component in the case of a time-averaged consideration of loading, so as to reduce the duration of the MR control sequence by optimized utilization of the available component specification.

The method according to the invention, particularly the embodiment described immediately above, may also be used for sequence modules, which sequence modules are configured to generate and/or acquire raw data from a subregion of the examination region and/or from the examination region with defined phase coding. Such a sequence module accordingly includes generation and/or acquisition of the raw data with just one phase coding step. A further such sequence module accordingly preferably includes generation and/or acquisition of the raw data with just one further phase coding step. The original MR control sequence preferably has a number of sequence modules that include the first sequence module and the second sequence module. The multiple sequence modules typically differ from one another in their phase coding steps. According to the prior art, such sequence modules are typically arranged in the original time progression with increasing or decreasing amplitude of the gradient pulse that generates the respective phase coding step. In this way, directly successive sequence modules in a first portion of the original MR control sequence have above-average amplitudes of the gradient pulses for phase coding, and in a second portion of the original MR control sequence have below-average amplitudes of the gradient pulses for phase coding. The greater the amplitude of the gradient pulses, the higher typically is the loading of the component. If such an original MR control sequence were optimized according to this embodiment of the method, the optimized time progression of the multiple sequence modules could for example alternately use above-average and below-average amplitudes of the gradient pulses for phase coding. In this way, the loading of the component may be balanced during play-out of the MR control sequence averaged over a period comprising two successive sequence modules, i.e. designed to be largely constant, preferably with low fluctuation. The method according to the invention, and in particular this embodiment, allow thermally balanced driving of the component in the case of a time-averaged consideration of the thermal load to reduce measurement time by optimized utilization of the available performance.

In another embodiment of the method, optimization of the time progression includes selection of an interval. The interval preferably relates to a duration between the first sequence module and the second sequence module. A duration may accordingly be actively inserted into the MR control sequence, which duration is free of RF pulses and a gradient pulse and a read-out window during execution of the MR control sequence. In this way, the time characteristic of the loading of the component may be determined in a particularly balanced way when the MR control sequence is being executed.

The aforementioned component can be any of the following elements:
gradient coil arrangement,
gradient coil,
gradient amplifier,
gradient cable,
RF amplifier,
RF antenna unit,
RF cable,
filter plate.

A gradient cable may connect the gradient amplifier to a gradient coil. An RF cable may connect the RF amplifier to the RF antenna unit. A gradient amplifier is typically configured to condition a voltage and/or a power so as to supply the gradient coil arrangement with the conditioned voltage and/or power so that gradient pulses are generated in accordance with the MR control sequence. An RF amplifier is typically configured to condition a voltage so as to supply the RF antenna unit with the conditioned voltage so that RF pulses are generated in accordance with the MR control sequence. The stated elements are typically exposed to a high load, for example through a high electrical voltage and/or associated heat, when the MR control sequence is being executed. Monitoring of such an element by regarding this element as a component according to the method according to the invention is accordingly particularly advantageous.

In another embodiment of the method, the component is described by a time constant that is greater than a duration of the first sequence module and/or of the second sequence module. The component accordingly has a time constant or the property of the component is characterized by the time constant. The time constant preferably relates to a temperature of the component. Of particular interest are time that are longer than the duration of a sequence module. The duration of a sequence module typically amounts to between ten milliseconds and several hundred milliseconds.

Components with a time constant of at least a hundred milliseconds, preferably at least ten milliseconds, are accordingly given particular consideration in the method according to the invention. After thermal loading by the first sequence module, such components also typically undergo significant heating in the case of subsequent sequence modules on the basis of the first sequence module, for which reason an optimized temporal arrangement of the sequence modules included in the MR control sequence is particularly advantageous. In particular, gradient coil arrangements and transformers may have thermal time constants of a few minutes.

In another embodiment of the method, the first sequence module is configured for a first diffusion weighting and the second sequence module for a second diffusion weighting. Such an MR control sequence may accordingly be used for diffusion imaging. In diffusion imaging, a number of diffusion-coded image data sets with different diffusion weightings, i.e. with different diffusion gradients, are acquired and combined together. The strength of the diffusion weighting is generally defined by the "diffusion weighting factor", also known as the "b-value". In addition, a diffusion weighting may be characterized by a spatial direction in which the diffusion weighting acts. The different diffusion-coded image data or the diffusion-weighted image data to be combined therefrom may then be used for the desired diagnostic purposes. The first sequence module and the second sequence module accordingly preferably generate mutually different diffusion weightings, which differ in their b-value and/or in their direction. A number of sequence modules with at least partly different diffusion weightings are typically used in the diffusion imaging.

This is considered below with reference to an example. An MR control sequence has, for example, at least 30 sequence modules, of which three sequence modules have a b-value of 0 without directional characteristic, four sequence modules have a b-value of 500 s/mm$^2$ in each case in three directions and five sequence modules have a b-value of 1000 s/mm$^2$ in each case in three directions. According to the prior art, the maximum b-value, i.e. 1000 s/mm$^2$, determines the thermal loading GT (1000) and thus the necessary measuring interval Tb'.

With the time progression of the 30 sequence modules optimized using this embodiment of the method according to the invention, reduced thermal loading GTb may be assumed, taking account of the thermal loading of the component as a time-based average: GTb ∝3/30 GT(0)+12/30 GT(500)+15/30 GT(1000)≈0.7 GT(1000). For this purpose, a linear relationship between the thermal loading of the component and the b-value is assumed. When Ta denotes the capture time needed for playing out the 30 sequence modules and Tb denotes the necessary measuring interval for the reduced thermal loading GTb, the following applies: Ta*GT(1000)/(Ta+Tb')=Ta*GTb/(Ta+Tb)≈0.7 Ta*GT(1000)/(Ta+Tb) and thus Tb≈0.7 Tb'−0.3 Ta.

Taking account of the base load of the component, the reduction in interval duration turns out to be lower than stated. To achieve the reduction in interval duration, a correspondingly optimized time progression of the sequence modules is typically necessary. To this end, uniform thermal loading of the component is preferably sought.

For corresponding optimization of the time progression of $\Sigma_{n=1}^{N} R_n W_n$ sequence modules with N b-values in each case with $R_n$ directions and $W_n$ repetitions, it is for example possible to proceed as follows:

1. Determination of the b-value $b_i$ for which $A_{Max}=R_i*W_i$ is maximal (i∈1, . . . N).
2. Inclusion in a list L of all the combinations of direction and repetition to be captured for the b-value $b_i$. The list L is preferably empty prior to inclusion of these combinations.
3. Determination of $A_j=R_j*W_j$ (j ∈1, . . . N) for a next b-value $b_j$, of which the combinations of direction and repetition to be captured have not hitherto been included in the list L.

4. Determination of a relative frequency $H_j=E/A_j$, wherein E is a current number of entries, i.e. captured b-values, in the list L. According to the definition of $A_{max}$, $H_j \geq 1$ is ensured. The relative frequency $H_j$ indicates how many entries in the list L occur in the b-value $b_j$. The relative frequency $H_j$ is not generally integral.

5. Setting a list index to a first entry in the list L and zeroing of a counter Z.

6. Selection of a combination of direction and repetition not as yet included in the list L for the b-value $b_j$.

7. Repeated incrementation of the list index and of the counter until the smallest Z is $\geq H$.

8. Insertion into the list L of the combination of direction and repetition for the b-value selected from the current list index.

9. Lowering of Z by H. Z may be negative. Z may also not be integral.

10. Return to step 6, provided not all combinations of direction and repetition have as yet been inserted into the list L for the b-value $b_j$.

11. Return to step 3, providing not all b-values $b_j$ with $j \in 1, \ldots N$ have as yet been considered.

If this method is applied to the above example with 30 sequence modules, the following time progression is obtained for the 30 sequence modules: b500(1,1), b0(1,1), b1000(1,1), b500(1,2), b1000(1,2), b500(1,3), b1000(1,3), b1000(2,1), b500(2,1), b1000(2,2), b500(2,2), b0(2,1), b1000(2,3), b500(2,3), b1000(3,1), b500(3,1), b1000(3,2), b1000(3,3), b500(3,2), b1000(4,1), b500(3,3), b0(3,1), b1000(4,2), b500(4,1), b1000(4,3), 500(4,2), b1000(5,1), b1000(5,2), b500(4,3), b1000(5,3). The first value between parentheses here indicates the repetition number and the second value the direction, numbered 1, 2, 3.

According to this optimized time progression of the sequence modules, a maximum of exponent mm² two successive sequence modules have a b-value of 1000 s/mm². Before and after, a sequence module is provided with a smaller b-value. The intervals may thus be shortened in accordance with the above calculation. The original MR control sequence on the other hand typically has a time progression according to which at least the sequence modules with a b-value of 1000 s/mm² of the fourth and fifth repetition are measured in direct succession in each case in 3 directions. Thus, when these six sequence modules are being executed, the thermal loading of the component is particularly high, whereby correspondingly long intervals are typically necessary to comply with the limitation of the component. Simulations show that, using the method according to the invention, the duration of head imaging using diffusion or tensor imaging and the duration of abdominal imaging may be reduced by at least 10% to 20%. In this case, all the power-related components may be operated within the limitations of their specifications.

In another embodiment of the method, the component is a gradient coil arrangement having at least two gradient coils for generating magnetic field gradients in at least two mutually different directions, the property of the component comprises a maximum power for a first one of the at least two gradient coils and a maximum power for a second one of the at least two gradient coils, the first requirement comprises a first item of information relating to a first direction of the at least two mutually different directions and/or the second requirement comprises a second item of information relating to a second direction of the at least two mutually different directions and, for time progression optimization, the at least two mutually different directions and the first item of information and/or the second item of information are taken into account.

This embodiment is particularly advantageous if the first sequence module puts an above-average strain on the first gradient coil, in particular provides a large number of gradient pulses and/or gradient pulses with a high amplitude in the first direction. This embodiment is particularly advantageous if the second sequence module puts an above-average strain on the second gradient coil, in particular provides a large number of gradient pulses and/or gradient pulses with a high amplitude in the second direction. The first direction and the second direction preferably each correspond to one physical axis of the magnetic resonance scanner. According to this embodiment, the time progression of the sequence modules can be adapted such that the individual gradient coils of the gradient coil arrangement are loaded as uniformly as possible.

An example of this embodiment will be explained below with reference to a set M having at least three sequence modules. The gradient coil arrangement has, for example, three gradient coils for generating magnetic field gradients in three mutually different directions. Optimization of the time progression may proceed according to the following method steps:

1. Transfer of a first sequence module of the set M to an order list AL. The transferred first sequence module places an above-average, high requirement on the first direction. The transferred first sequence module is designed to generate magnetic field gradients predominantly in a first direction.

2. Selection of a second sequence module of the remaining set M, wherein the second sequence module of the remaining set M places an above-average, high requirement on a second direction. In particular, the second sequence module of the remaining set M is designed for the generation of magnetic field gradients predominantly in a second direction. The second direction is orthogonal or substantially orthogonal to the first direction. In this case, the amount of the vector product of the first direction and the second direction may be used as a measure of orthogonality: the smaller it is, the more orthogonal.

3. Transfer of the selected second sequence module from the set M into the order list AL.

4. Selection of a third sequence module of the remaining set M, wherein the third sequence module of the remaining set M places an above-average, high requirement on a further direction. The third sequence module of the remaining set M is designed for the generation of magnetic field gradients predominantly in a further direction. The further direction is orthogonal or substantially orthogonal to the directions of the last two selected sequence modules. In this case, the amount of the vector product of the further direction and the cross product of the directions of the last two selected sequence modules are used as a measure of orthogonality.

5. Transfer of the selected third sequence module from the set M into the order list AL.

6. Return to step 4, if the set M is not yet empty.

The first direction, the second direction and/or the further direction may correspond to the three mutually different directions of the gradient coil arrangement, or may be independent of the three mutually different directions of the gradient coil arrangement. The first direction, the second direction and/or the further direction preferably define the same space as the three mutually different directions of the gradient coil arrangement.

According to this embodiment, the loading of the gradient coil arrangement on the basis of a sequence module is accordingly taken into account with regard to the spatial direction of the gradient pulse and the individual gradient coil concerned. In this way, optimization of the MR control sequence may proceed particularly precisely and efficiently. The duration of the MR control sequence may in this way be particularly greatly shortened. In diffusion tensor imaging in particular, sequence modules are provided with diffusion weightings in multiple different directions, whereby this embodiment of the method according to the invention is particularly effective for MR control sequences in diffusion tensor imaging.

The magnetic resonance scanner is operated by the optimized MR control sequence. This means execution of the optimized MR control sequence using the magnetic resonance scanner. The examination duration may be shortened thereby.

In another embodiment of the method, the at least two sequence modules are selected from a number of sequence modules. The MR control sequence typically comprises a plurality of sequence modules, i.e. more than the at least two sequence modules. In certain MR control sequences, it is possible to dispense with individual and/or specific ones of the sequence modules included thereby. In such a case, less raw data is typically generated and/or acquired, wherein the absent raw data may for example be compensated for by means of interpolation or by reducing the resolution of the data to be generated. In such an MR control sequence, it is for example possible for selection of the at least two sequence modules from the plurality of sequence modules to proceed after detection of the property of the component. When selecting the at least two sequence modules from the plurality of sequence modules, the property of the component is preferably taken into account. In the case, in particular, of MR control sequences and/or sequence modules which place a severe load on the component, such a method may enable a short capture duration.

Furthermore, the invention concerns a magnetic resonance (MR) apparatus having an MR data acquisition scanner that includes the above-described component, and a control computer in communication with an optimization processor configured to implement the method according to the invention for optimizing a time progression of an MR control sequence, as described above. To this end, the optimization processor has an input, processor circuitry, and an output. Via the input, the optimization processor is provided with an MR control sequence to be optimized and/or a property of the Component of the MR scanner. Further functions, algorithms or parameters required in the method also may be provided to the optimization processor via the input. The optimized time progression of the MR control sequence and/or further results of an embodiment of the method according to the invention are provided via the output. Control signals corresponding to the optimized time progression of the MR control sequence are provided to the MR scanner from the computer so as to operate the MR scanner according to an optimized MR control sequence that includes the optimized time progression of the MR control sequence. The optimization processor may be integrated into the control computer of the MR scanner or be installed separately from the control computer or may be connected to the control computer.

Embodiments of the magnetic resonance apparatus according to the invention correspond to the embodiments of the method according to the invention as described above. The magnetic resonance apparatus or the scan thereof may have further control components which are necessary and/or advantageous for implementing the method according to the invention. The magnetic resonance apparatus may also be configured to transmit control signals and/or to receive and/or process control signals, so as to implement the method according to the invention. The optimization processor is preferably part of the control computer of the magnetic resonance scanner according to the invention. Computer programs and further software, by which the optimization processor automatically controls and/or performs the method according to the invention, may be stored in a memory of the optimization processor.

The present invention also encompasses a non-transitory, computer-readable data storage medium encoded with programming instructions that, when the storage medium is loaded into a computer or computer system of a magnetic resonance imaging apparatus, cause the computer or computer system to operate the magnetic resonance imaging apparatus so as to implement any or all of the embodiments of the method according to the invention, as described above.

Examples of electronically readable data storage media are a DVD, a magnetic tape or a USB stick on which electronically readable control information, in particular software, is stored. If this control information (software) is read from the data storage medium and stored in the control computer and/or the optimization processor of the magnetic resonance apparatus, all the embodiments according to the invention of the previously described method can be executed.

The advantages of the electronically readable data storage medium according to the invention correspond substantially to the advantages of the method according to the invention, as described above.

DESCRIPTION OF THE PREFERRED EMBODIMENTS

Figure 1:
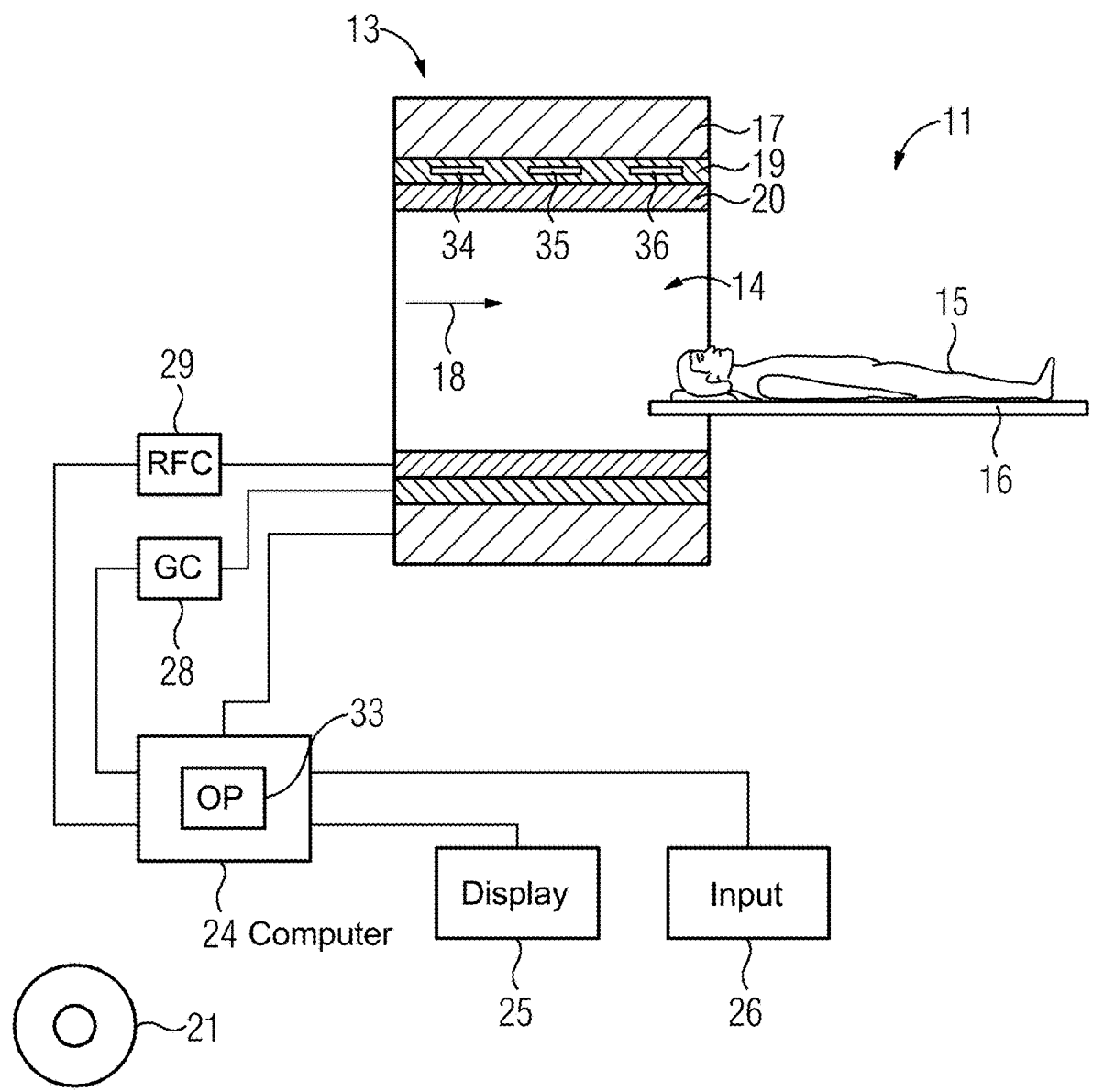
FIG. 1 schematically illustrates a magnetic resonance apparatus according to the invention.

FIG. 1 is a schematic illustration of a magnetic resonance apparatus 11 for carrying out the method according to the invention. The magnetic resonance apparatus 11 has an MR data acquisition scanner 13 with a basic field magnet 17 that generates a strong and constant basic magnetic field 18. The scanner 13 also has a cylindrical patient accommodation zone 14 for receiving a patient 15. The patient accommodation zone 14 is cylindrically enclosed around its circumference by the scanner 13. The patient 15 can be advanced into the patient accommodation zone 14 by a patient positioning apparatus 16. The patient positioning apparatus 16 has a patient table that is movable within the scanner 13.

The scanner 13 has a gradient coil arrangement 19, which spatially encodes MR signals during imaging. The gradient coil arrangement 19 has three gradient coils 34, 35, 36, which each generate a magnetic field gradient respectively in one of three different directions. The three different directions are preferably orthogonal to one another. The gradient coil arrangement 19 also includes a gradient amplifier and/or a gradient cable connecting the gradient amplifier to each gradient coil, and/or a filter for the gradient cable.

The gradient coil arrangement 19 is driven by a gradient controller 28. The scanner 13 further has comprises a radio-frequency (RF) antenna 20, which in the case shown is a body coil fixedly integrated into the scanner 13, and an RF antenna controller 29. The RF antenna 20 is driven by the RF antenna controller 29 so as to emit RF pulses into an examination volume that is substantially formed by the patient accommodation zone 14. The RF pulses produce a magnetization of certain nuclear spins in the patient 15, thereby causing these excited nuclear spins to deviate from the direction of the basic magnetic field 18. As these excited nuclear spins relax and return to the steady state, they emit RF signals, which are the aforementioned MR signals. These MR signals are detected by the same RF antenna from which the pulses were radiated, or by a different antenna.

The component of the magnetic resonance apparatus 11 of which the property is determined as described below can be any of the gradient coil arrangement 19, any of the gradient coils 34, 35, 36, the gradient amplifier, the RF antenna 20, the RF amplifier, the cable filter, the gradient cable and RF cable, or a combination of the above. The component preferably is the gradient coil arrangement 19 or a part thereof. The component is described by a time constant, which time constant is greater than a duration of the first sequence module and/or of the second sequence module.

The magnetic resonance apparatus 11 has a control computer 24 that controls the basic field magnet 17, the gradient controller 28 and the RF antenna controller 29. The control computer 24 centrally controls the magnetic resonance apparatus 11, such as for the performance of MR control sequences. In addition, the control computer 24 has a reconstruction processor that reconstructs medical image data from the raw data detected during the magnetic resonance examination. The magnetic resonance apparatus 11 comprises a display unit 25. Control information, such as control parameters, and reconstructed image data, may be displayed for a user on the display unit 25, for example on at least one monitor. The magnetic resonance apparatus 11 further has an input unit 26, via of which information and/or control parameters can be entered by a user during a measurement procedure. The control computer 24 may include the gradient controller 28 and/or the RF antenna controller 29 and/or the display unit 25 and/or the input unit 26.

The control computer 24 has an optimization processor 33. The optimization processor 33 is designed to carry out the method for optimizing a time progression of an MR control sequence. To this end, the optimization processor 33 has computer programs and/or software, which may be loaded directly into a memory of the optimization processor 33, with program code that causes the method for optimizing a time progression of an MR control sequence to be executed when the computer programs and/or software is/are run in the optimization processor 33. The optimization processor 33 has a processor circuitry designed to run the computer programs and/or software. The computer programs and/or software may also be stored on an electronically readable data storage medium 21 configured separately from the control computer 24, can be loaded into the computer 24.

The illustrated magnetic resonance apparatus 11 may of course has further components that magnetic resonance apparatuses usually have. The general mode of operation of a magnetic resonance apparatus is known to those skilled in the art and therefore a more detailed description of such operation is not necessary herein.

As noted, the method for optimizing a time progression of an MR control sequence can be stored in the form of a computer-readable code or an electronically readable data storage medium 21.

Figure 2:
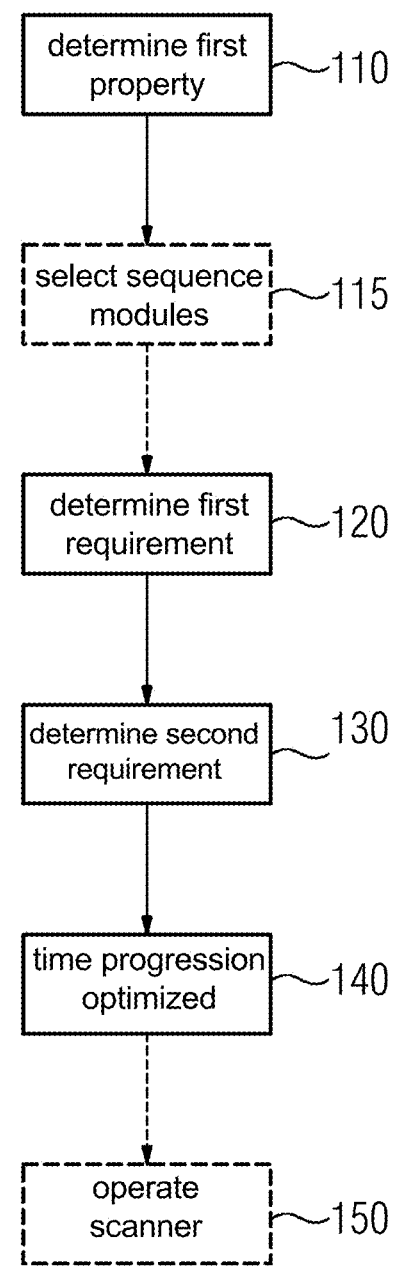
FIG. 2 is a flowchart of an embodiment of the method according to the invention.

FIG. 2 is a flowchart of an embodiment of a method according to the invention. The method typically starts with an MR control sequence requiring optimization. The MR control sequence to be optimized is typically present in an original version, which original MR control sequence is not adapted to the magnetic resonance apparatus 11 and/or the component and/or a specific measurement and/or the object under investigation. The magnetic resonance apparatus 11 may be driven according to the optimized MR control sequence and/or with the original MR control sequence. The original MR control sequence has at least two sequence modules M1, M2. The time progression of the at least two sequence modules M1, M2 is intended to be optimized within the framework of the method according to the invention. A first sequence module of the at least two sequence modules M1, M2 is M1, and a second sequence module of the at least two sequence-modules M1, M2 is M2.

For this purpose, first a property of at least one of the components noted above in the magnetic resonance apparatus 11 is ascertained in method step 110. In method step 120, a first requirement placed on the component is ascertained for the first sequence module M1. In method step 130, a second requirement placed on the component is ascertained for the second sequence module M2. The method steps 110, 120, 130 may be carried out in any desired time order and/or at least in part simultaneously. In method step 140, optimization of the time progression of the at least two sequence modules takes place, taking account of the property, the first requirement and the second requirement.

The original MR control sequence typically includes multiple sequence modules. Depending on the investigation to be performed, it is possible to dispense with certain of these sequence modules. For instance, according to an embodiment of the method in method step 115, the at least two sequence modules M1, M2 may optionally be selected from a number of sequence modules. Method step 115 is typically carried out prior to method steps 120 and 130. In a further method step 150, the magnetic resonance scanner 13 is operated by the optimized MR control sequence.

The first requirement may be the component power required for the first sequence module M1. The second requirement may be the component power required for the second sequence module M2. The property may indicate a limitation, in particular a maximum power and/or a loading capacity, for the component. Optimization of the time progression of the at least two sequence modules M1, M2 and/or of the MR control sequence typically proceeds such that the first requirement and the second requirement are satisfied over a time-based average of the property of the component. Optimization of the time progression of the at least two sequence modules M1, M2 and/or of the MR control sequence typically proceeds such that a duration of one part of the MR control sequence that includes the first sequence module M1 and the second sequence module M2 and/or a total duration of the MR control sequence is/are reduced, in particular minimized. Optimization of the time progression of the at least two sequence modules M1, M2 and/or of the MR control sequence typically proceeds such that loading of the component on the basis of the first requirement and on the basis of the second requirement is constant over a time-based average. Optimization of the time progression may be a selection of an interval. The first sequence module M1 may be configured for a first diffusion weighting. The second sequence module M2 may be configured for a second diffusion weighting.

If the component comprises the gradient coil arrangement 19 with at least two of the three gradient coils 34, 35, 36 and the property of the component comprises a maximum power for the at least two of the three gradient coils 34, 35, 36, the first requirement may be a first item of information relating to a first direction of the mutually different directions and/or the second requirement may be a second item of information relating to a second direction of the mutually different directions. The at least two mutually different directions and/or the first item of information and/or the second item of information are preferably taken into account during optimization of the time progression.

Figure 3:
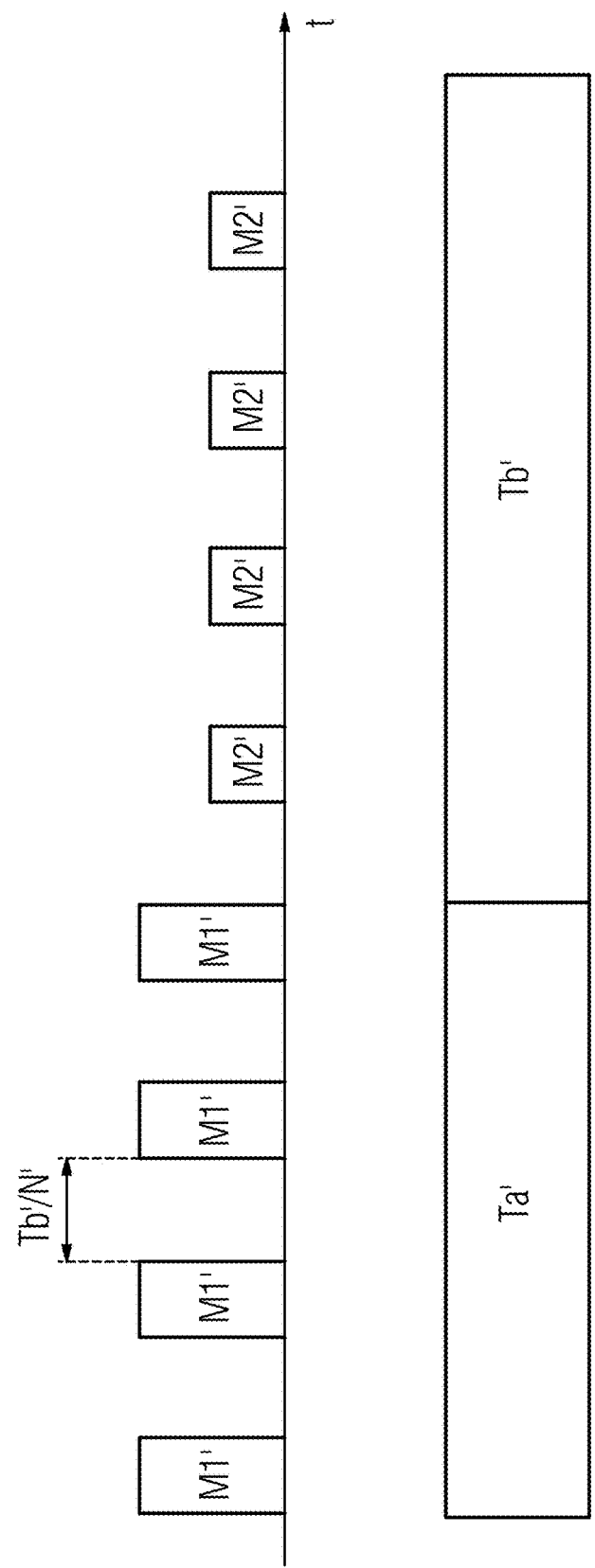
FIG. 3 schematically shows a time progression of an MR control sequence known from the prior art.

FIG. 3 shows a schematic diagram of a time progression known from the prior art of an MR control sequence, i.e. a conventional time progression of a conventional MR control sequence. The schematic diagram preferably indicates an excerpt of the conventional time progression of the conventional MR control sequence. The conventional MR control sequence may correspond to the original MR control sequence. FIG. 3 shows the time progression of the conventional sequence modules M1', M2' as a function of time t. In the vertical direction there is indicated the requirement, associated with a sequence module, placed on the component, for example the thermal loading of the component, in particular of the gradient coil arrangement 19. In addition, FIG. 3 depicts a ratio of the capture time Ta' to the conventional interval time Tb'. The capture time Ta' indicates the duration needed for activating the conventional sequence modules M1', M2'. The conventional interval time Tb' indicates the entire duration of the intervals which determines activation of the conventional sequence modules M1', M2' in the stated time order, in particular to satisfy the property of the component.

The conventional MR control sequence has a number of sequence modules, wherein the plurality is quantified by N' and/or the depicted excerpt of the conventional time progression includes N' sequence modules. The conventional MR control sequence depicted in FIG. 3 has four sequence modules M1' and four sequence modules M2'. The sequence modules M1' place a higher requirement on the component than do sequence modules M2'. An interval of duration Tb'/N' is arranged between two temporally successive sequence modules Mr, M2'. The conventional MR control sequence is designed such that during this interval no RF pulses and/or gradient pulses are activated and/or MR signals are acquired. The duration Tb'/N' is typically selected so as to prevent overloading of the component due to thermal loading on the basis of a sequence module M1' and/or on the basis of the four successive sequence modules M1'. The duration Tb'/N' between two successive sequence modules typically influences a contrast of the image data to be generated on the basis of relaxation effects. It is accordingly typically advantageous to select the time progression of the sequence modules M1', M2' with a constant duration Tb'/N' between two successive sequence modules M1', M2', in particular so as to generate image data with a uniform contrast.

Figure 4:
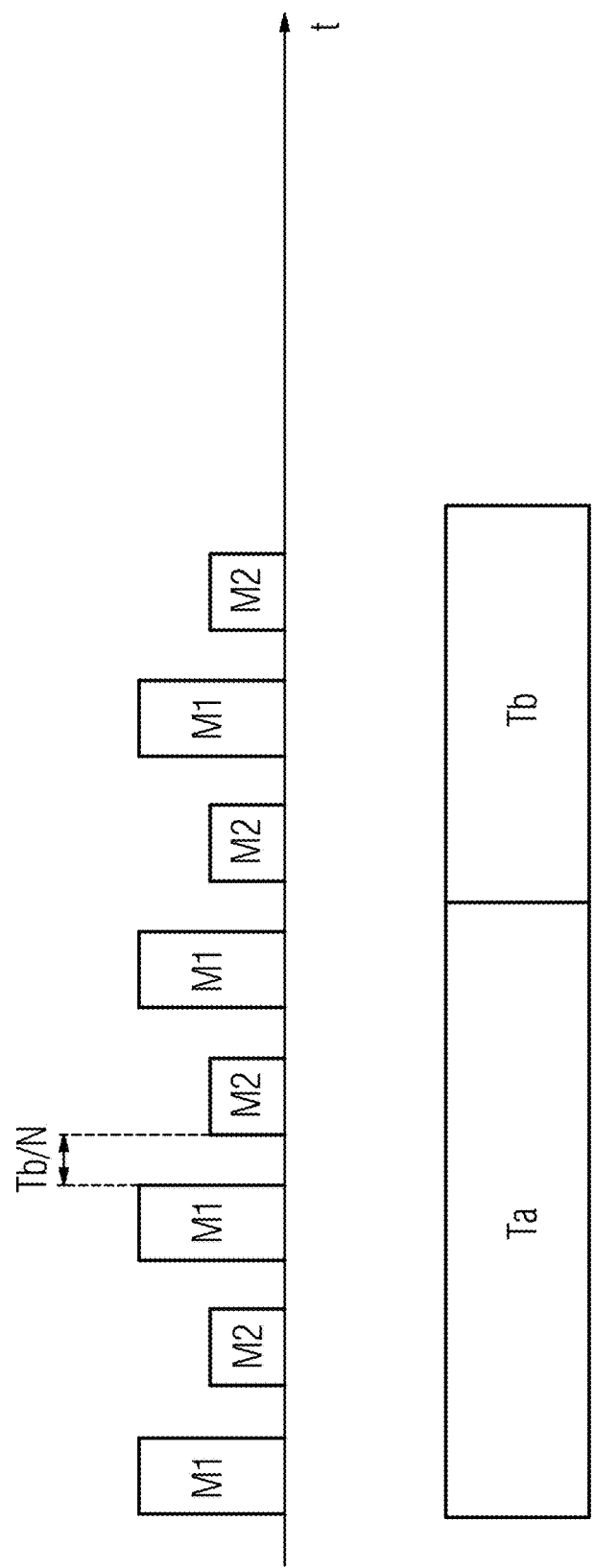
FIG. 4 schematically shows an optimized time progression of an MR control sequence in accordance with the invention.

FIG. 4 schematically illustrates an optimized time progression of an MR control sequence. The schematic diagram preferably indicates an excerpt of the optimized time progression of the MR control sequence. FIG. 4 shows the optimized time progression of the sequence modules M1', M2' as a function of time t. In the vertical direction there is indicated the requirement, associated with a sequence module, placed on the component, for example the thermal loading of the component, in particular of the gradient coil arrangement 19. In addition, FIG. 4 depicts a ratio of the capture time Ta to the interval time Tb. The capture time Ta indicates the duration needed for activating the sequence modules M1, M2. The interval time Tb indicates the entire duration of the intervals which determines activation of the sequence modules M1, M2 in the stated time progression, in particular to satisfy the property of the component.

The MR control sequence has a number of sequence modules, this number being quantified by N, and/or the depicted excerpt of the time progression has N sequence modules. The MR control sequence depicted in FIG. 4 comprises four sequence modules M1 and four sequence modules M2. The sequence modules M1 place a higher requirement on the component than do sequence modules M2. An interval of duration Tb/N is arranged between two temporally successive sequence modules M1, M2. The MR control sequence is designed such that during this interval no RF pulses and/or gradient pulses are activated and/or MR signals are acquired. A sequence module M1 may correspond to a sequence module M1' in FIG. 3. A sequence module M2 may correspond to a sequence module M2' in FIG. 3.

The method according to the invention and the effect thereof is hereinafter explained with reference to an example, taking account of FIGS. 3 and 4.

The original MR control sequence preferably has four sequence modules M1 and four sequence modules M2. The optimized time progression of the total of eight sequence modules M1, M2 is shown in FIG. 4. The time progression of the total of eight sequence modules M1', M2' in FIG. 3 may correspond to the time progression of the original MR control sequence. The sequence modules M1 may each be configured for a first diffusion weighting with a first b-value. The sequence modules M2 may each be configured for a second diffusion weighting with a second, b-value. The sequence modules M1, M2 preferably each comprise an excitation module, a diffusion coding module and a read-out module. A diffusion coding module is characterized by the b-value of the sequence module and/or the direction of the diffusion weighting. When performing head investigations, two or three diffusion weightings are typically used, each with one, three, four or more directions.

The component for example comprises a gradient coil arrangement 19, preferably with a gradient amplifier. The property of the gradient coil arrangement 19 has a limitation, in particular a maximum admissible value, for the thermal loading of the gradient coil arrangement 19. Thermal loading of the gradient coil arrangement 19 by a sequence module is typically proportional to the b-value of the diffusion weighting generated by the sequence module.

As a first requirement placed on the component for the sequence module M1, the thermal loading of the gradient coil arrangement 19 is determined by the sequence module M1. It is thus ascertained to what thermal loading the gradient coil arrangement 19 is exposed while the sequence module M1 is being activated. As a second requirement placed on the component for the sequence module M2, the thermal loading of the gradient coil arrangement 19 is determined by the sequence module M2. It is thus ascertained to what thermal loading the gradient coil arrangement 19 is exposed when the sequence module M2 is playing out. The second requirement ascertained in this way preferably applies to the sequence modules M2 included in the original MR control sequence.

Conventional MR control sequences for diffusion imaging have a time progression of sequence modules for diffusion weighting with a typically gradually increasing b-value. According to the prior art, the maximum b-value within an MR control sequence and the thermal loading associated with the maximum b-value determine the duration of the intervals between two temporally successive sequence modules. The duration of the intervals between two temporally successive sequence modules is preferably constant within an MR control sequence. In conventional MR control sequences, the timing of the at least two sequence modules is accordingly configured in such a way that, over an extended period, in particular over a period which is longer than the characteristic time constant of the gradient coil arrangement 19, sequence modules with a maximum b-value may be applied. To calculate an interval and thus to determine the conventional time progression of the sequence modules, the maximum b-value of the MR control sequence is accordingly typically relevant. The characteristic time constant of the gradient coil arrangement 19 may be from a few milliseconds up to several minutes.

According to the inventive method, the limitation of the component, i.e. the limitation of gradient coils 34, 35, 36, and the influence of sequence modules M1, M2 on gradient coils 34, 35, 36 are preferably taken into account as early as during definition of the time progression of the sequence modules M1, M2. Thus, for example, the time progression of the sequence modules M1, M2 having diffusion weightings and the directions thereof may be designed such that all the gradient coils 34, 35, 36 are as far as possible uniformly thermally loaded over the period of the MR control sequence and/or over the period of the entire patient investigation. The time progression is preferably selected such that the thermal loading is also uniform within the characteristic time of the component and/or exhibits differences of at most 30%, preferably at most 15%. The necessary time interval Tb/N between two temporally successive sequence modules M1, M2 may thereby be reduced in comparison with the conventional time interval Tb'/N'. Consequently, the time interval Tb required for the optimized MR control sequence may be reduced in comparison with the conventional time interval Tb'. The capture time Ta' of the conventional MR control sequence corresponds to the capture time Ta of the optimized MR control sequence, if the sequence modules M1 and M1' and the sequence modules M2 and M2' match and the two MR control sequences each comprise the same number N, N'. In this way, the total duration Ta+Tb of the optimized MR control sequence is also reduced in comparison with the total duration Ta'+Tb' of the conventional MR control sequence.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for optimizing a time progression of a magnetic resonance (MR) control sequence, said method comprising:

providing a computer with an MR control sequence with which an MR imaging apparatus, comprising an MR scanner and a plurality of apparatus components, is operable in order to acquire MR data from a subject, said MR control sequence comprising a first time portion and a second time portion, the second time portion being temporally after the first time portion, wherein each of the first and the second time portions of the MR control sequence include: at least one radio frequency (RF) pulse to be emitted by the MR scanner, at least one gradient pulse to be emitted by the MR scanner, and/or at least one read-out window in which induced magnetic resonance signals are acquired by the MR scanner;

providing said computer with an electronic input designating a property of at least one of said components;

in said computer, determining a first requirement of said at least one component, associated with use of said at least one component in said MR imaging apparatus when acquiring said MR data from the patient, for the first time portion of the MR control sequence;

in said computer, determining a second requirement of said at least one component, associated with use of said at least one component in said MR imaging apparatus when acquiring said MR data from the patient, for the second time portion of the MR control sequence;

in said computer, optimizing a time progression of said first and second time portions, dependent on said property, said first requirement, and said second requirement, to adapt an order of the first and second time portions of the MR control sequence, and thereby producing an optimized MR control sequence, and generating electronic control signals corresponding to said optimized MR control sequence; and providing said electronic control signals from said computer to said MR imaging apparatus and thereby operating said MR imaging apparatus according to said optimized MR control sequence in order to acquire said MR data from the patient.

2. A method as claimed in claim 1 wherein said first requirement is a power of said at least one component required by said at least one component during said first time portion, and said second requirement is a power of said at least one component required by said at least one component during said second time portion.

3. A method as claimed in claim 1 wherein said property is a limitation on said use of said component in said MR imaging apparatus during the acquisition of said MR data from the patient.

4. A method as claimed in claim 1 comprising, in said computer, optimizing said time progression so as to cause said first requirement and said second requirement to each comply with said property over a time-based average.

5. A method as claimed in claim 1 comprising, in said computer, optimizing said time progression to minimize a time duration of a portion of said MR control sequence that includes said first time portion and said second time portion.

6. A method as claimed in claim 1 comprising, in said computer, optimizing said time progression to minimize a duration of an entirety of said MR control sequence.

7. A method as claimed in claim 1 comprising, in said computer, optimizing said time progression so that a load of said at least one component, based on said first requirement and said second requirement, is constant over a time-based average.

8. A method as claimed in claim 1 comprising, in said computer, optimizing said time progression by selecting an interval between said first time portion and said second time portion.

9. A method as claimed in claim 1 wherein said component is selected from the group consisting of a gradient coil arrangement of said MR scanner, a gradient coil of said MR scanner, a gradient amplifier of said MR scanner, a gradient cable connected to a gradient coil of said MR scanner, an RF amplifier of said MR scanner, an RF antenna of said MR scanner, an RF cable connected to an RF antenna of said MR scanner, and a filter in a cable connected to or within said MR scanner.

10. A method as claimed in claim 1 wherein said component is describable by a time constant, said time constant being longer than a duration of at least one of said first time portion and said second time portion.

11. A method as claimed in claim 1 wherein said first time portion is designed for a first diffusion weighting of said MR data and said second time portion is designed for a second diffusion weighting of said MR data.

12. A method as claimed in claim 1 wherein said component is a gradient coil arrangement of said MR scanner, comprising at least two gradient coils that respectively produce magnetic field gradients in at least two different directions, and wherein the property of said component is a maximum power for a first of said at least two gradient coils and a maximum power for a second of said at least two gradient coils, said first requirement comprising a first item of information relating to a first direction of the at least two different directions, and said second requirement comprises a second item of information relating to a second direction of said at least two different directions, and comprising, in said computer, optimizing said time progression dependent on said at least two different directions, said first item of information, and said second item of information.

13. A method as claimed in claim 1 comprising, in said computer, selecting said first and second time portions of the MR control sequence from a plurality of time portions of the MR control sequence accessible by said computer.

14. A method as claimed in claim 1 wherein the optimized MR control sequence includes the adapted order of the first and second time portions, the adapted order including the first and second time portions in a different temporal order within the optimized MR control sequence than the order of the first and second time portions within the MR control sequence.

15. A method as claimed in claim 1 wherein adapting the order of the first and second time portions of the MR control sequence comprises changing a time order of the first and second time portions within the optimized MR control sequence.

16. A magnetic resonance (MR) imaging apparatus comprising:
an MR data acquisition scanner including a plurality of components;
a computer that is provided with:
an MR control sequence with which said MR scanner is operable in order to acquire MR data from a subject, said MR control sequence comprising a first time portion and a second time portion, the second time portion being temporally after the first time portion, wherein each of the first and the second time portions of the MR control sequence include: at least one radio frequency (RF) pulse to be emitted by the MR scanner, at least one gradient pulse to be emitted by the MR scanner, and/or at least one read-out window in which induced magnetic resonance signals are acquired by the MR scanner; and
an electronic input designating a property of at least one component of said plurality of components;
wherein said computer is configured to:
determine a first requirement of said at least one component, associated with use of said at least one component in said MR imaging apparatus when acquiring said MR data from the patient, for the first time portion of the MR control sequence;
determine a second requirement of said at least one component, associated with use of said at least one component in said MR imaging apparatus when acquiring said MR data from the patient, for the second time portion of the MR control sequence;
optimize a time progression of said first and second time portions, dependent on said property, said first requirement, and said second requirement, to adapt an order of the first and second time portions of the MR control sequence, so as to thereby produce an optimized MR control sequence, and to generate electronic control signals corresponding to said optimized MR control sequence; and
provide said electronic control signals from said computer to said MR imaging apparatus and thereby operate said MR imaging apparatus according to said optimized MR control sequence in order to acquire said MR data from the patient.

17. A magnetic resonance (MR) imaging apparatus as claimed in claim 16 wherein the at least one component is selected from the group consisting of a gradient coil arrangement of said MR scanner, a gradient coil of said MR scanner, a gradient amplifier of said MR scanner, a gradient cable connected to a gradient coil of said MR scanner, an RF amplifier of said MR scanner, an RF antenna of said MR scanner, an RF cable connected to an RF antenna of said MR scanner, and a filter in a cable connected to or within said MR scanner.

18. A magnetic resonance (MR) imaging apparatus as claimed in claim 16 wherein the at least one component comprises a gradient coil arrangement, the gradient coil arrangement including at least two gradient coils that respectively produce magnetic field gradients in at least two different directions, and wherein the property of said at least one component is a maximum power for a first of said at least two gradient coils and a maximum power for a second of said at least two gradient coils, said first requirement comprising a first item of information relating to a first direction of the at least two different directions, and said second requirement comprises a second item of information relating to a second direction of said at least two different directions, and comprising, in said computer, optimizing said time progression dependent on said at least two different directions, said first item of information, and said second item of information.

19. A non-transitory, computer-readable data storage medium encoded with programming instructions, said storage medium being loadable into a computer of a magnetic resonance (MR) imaging apparatus comprising an MR data acquisition scanner and a plurality of apparatus components, said programming instructions causing said computer to:
receive an MR control sequence with which said MR scanner and said plurality of apparatus components are operable in order to acquire MR data from a subject, said MR control sequence comprising a first time portion and a second time portion, the second time portion being temporally after the first time portion, wherein each of the first and the second time portions of the MR control sequence include: at least one radio frequency (RF) pulse to be emitted by the MR scanner, at least one gradient pulse to be emitted by the MR scanner, and/or at least one read-out window in which induced magnetic resonance signals are acquired by the MR scanner;
receive an electronic input designating a property of at least one of said components;

determine a first requirement of said at least one component, associated with use of said at least one component in said MR imaging apparatus when acquiring said MR data from the patient, for the first time portion of the MR control sequence;

determine a second requirement of said at least one component, associated with use of said at least one component in said MR imaging apparatus when acquiring said MR data from the patient, for the second time portion of the MR control sequence;

optimize a time progression of said first and second time portions, dependent on said property, said first requirement, and said second requirement, to adapt an order of the first and second time portions of the MR control sequence, and thereby produce an optimized MR control sequence, and generating electronic control signals corresponding to said optimized MR control sequence; and provide said electronic control signals to said MR imaging apparatus and thereby operate said MR imaging apparatus according to said optimized MR control sequence in order to acquire said MR data from the patient.

\* \* \* \* \*